United States Patent
Park et al.

(10) Patent No.: US 11,043,446 B2
(45) Date of Patent: Jun. 22, 2021

(54) SEMICONDUCTOR PACKAGE

(71) Applicant: SAMSUNG ELECTRONICS CO., LTD., Suwon-si (KR)

(72) Inventors: Jungsoo Park, Suwon-si (KR); Kyoungmoo Harr, Suwon-si (KR); Jihyun Lee, Suwon-si (KR); Doohwan Lee, Suwon-si (KR); Junggon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/662,360

(22) Filed: Oct. 24, 2019

(65) Prior Publication Data
US 2020/0144165 A1 May 7, 2020

(30) Foreign Application Priority Data

Nov. 5, 2018 (KR) .................. 10-2018-0134614

(51) Int. Cl.
| | |
|---|---|
| *H01L 29/06* | (2006.01) |
| *H01L 21/44* | (2006.01) |
| *H01L 23/495* | (2006.01) |
| *H01L 23/367* | (2006.01) |
| *H01L 23/48* | (2006.01) |

(52) U.S. Cl.
CPC .... *H01L 23/49568* (2013.01); *H01L 23/3672* (2013.01); *H01L 23/481* (2013.01); *H01L 2224/0233* (2013.01); *H01L 2224/0401* (2013.01)

(58) Field of Classification Search
CPC .................................................. H01L 23/481

USPC .......... 438/667–675; 257/621, 625, 698, 776
See application file for complete search history.

(56) References Cited

U.S. PATENT DOCUMENTS

| | | | | |
|---|---|---|---|---|
| 7,923,295 B2 * | 4/2011 | Shim | .................... | H01L 23/3128 438/109 |
| 8,039,303 B2 * | 10/2011 | Shim | .................... | H01L 23/5384 438/107 |
| 8,193,034 B2 * | 6/2012 | Pagaila | .................... | H01L 24/73 438/108 |
| 8,963,320 B2 | 2/2015 | Do et al. | | |
| 9,793,246 B1 * | 10/2017 | Tseng | ...................... | H01L 24/20 257/774 |
| 9,881,908 B2 * | 1/2018 | Lin | ......................... | H01L 25/50 257/777 |
| 10,707,150 B2 * | 7/2020 | Shim | ...................... | H01L 21/561 |

FOREIGN PATENT DOCUMENTS

KR 10-2017-0121666 A 11/2017

* cited by examiner

*Primary Examiner* — Calvin Lee
(74) *Attorney, Agent, or Firm* — Sughrue Mion, PLLC

(57) ABSTRACT

A semiconductor package includes a connection structure including a first insulating layer, a first redistribution layer disposed on the first insulating layer, and a first connection via penetrating through the first insulating layer and connected to the first redistribution layer, a semiconductor chip disposed on the connection structure, an encapsulant covering at least a portion of the semiconductor chip, a second insulating layer disposed on the encapsulant, a second redistribution layer including a signal line disposed on the encapsulant, and a heat dissipation layer disposed on the encapsulant and electrically insulated from the signal line.

18 Claims, 17 Drawing Sheets

SEMICONDUCTOR PACKAGE

CROSS-REFERENCE TO RELATED APPLICATION(S)

This application claims benefit of priority to Korean Patent Application No. 10-2018-0134614 filed on Nov. 5, 2018 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of semiconductor package technology suggested to satisfy the technical demand as described above is a fan-out semiconductor package. Such a fan-out package has a compact size and may allow a plurality of pins to be implemented by redistributing electrical connection structures outwardly of a region in which a semiconductor chip is disposed.

Meanwhile, the fan-out package has been recently required to improve heat dissipation characteristics necessary in a premium application processor (AP).

SUMMARY

An aspect of the present disclosure may provide a semiconductor package having a heat dissipation layer, excellent in terms of heat dissipation characteristics, and which does not affect signal lines of a wiring structure.

According to an aspect of the present disclosure, a semiconductor package may include a connection structure including a first insulating layer, a first redistribution layer disposed on the first insulating layer, and a first connection via penetrating through the first insulating layer and connected to the first redistribution layer, a semiconductor chip disposed on the connection structure, an encapsulant covering at least a portion of the semiconductor chip, a second insulating layer disposed on the encapsulant, a second redistribution layer including a signal line disposed on the encapsulant, and a first heat dissipation layer disposed on the encapsulant and electrically insulated from the signal line.

The second redistribution layer and the first heat dissipation layer may be disposed in the second insulating layer.

The first heat dissipation layer may be disposed on the second redistribution layer.

The first heat dissipation layer may be embedded in the second insulating layer and an upper surface of the first heat dissipation layer may be exposed from the second insulating layer.

A portion of the second redistribution layer may be disposed in a region in which the first heat dissipation layer and the semiconductor chip overlap in a thickness direction.

The second redistribution layer may include a ground line, and the first heat dissipation layer may be electrically connected to the ground line.

The first heat dissipation layer and the ground line may be connected to each other by a connection via penetrating through the second insulating layer.

The first heat dissipation layer may have a plate shape.

A portion of the second redistribution layer may be an exposed region exposed from the second insulating layer.

The semiconductor package may further include a surface treatment layer disposed on the exposed region of the second redistribution layer.

The exposed region of the second redistribution layer may be surrounded by the first heat dissipation layer when viewed from above.

The exposed region of the second redistribution layer may have a plurality of patterns spaced apart from each other when viewed from above.

The first heat dissipation layer may include a plurality of heat dissipation vias.

The semiconductor package may further include a second heat dissipation layer disposed below the connection structure.

The semiconductor package may further include a passivation layer disposed below the connection structure and embedding the first redistribution layer. The second heat dissipation layer is embedded in the passivation layer and a lower surface of the second heat dissipation layer is exposed from the passivation layer.

The semiconductor package may further include an underbump metal bump penetrating through the passivation layer and connected to the first redistribution layer of the connection structure.

The underbump metal bump may be surrounded by the second heat dissipation layer when viewed from below.

The semiconductor package may further include a frame disposed on the connection structure and including a through-hole, in which the semiconductor chip is disposed.

The frame may include a wiring via connecting the first and second redistribution layers to each other.

According to an aspect of the present disclosure, a semiconductor package may include: a semiconductor chip having connection pads; a frame including a through-hole, in which the semiconductor chip is disposed; an encapsulant covering portions of the semiconductor chip and the frame, and filling into portions of the through-hole; a connection structure, on which the frame and the semiconductor chip are disposed, including first insulating layers and first redistribution layers alternately disposed, first connection vias respectively penetrating through the first insulating layers and connecting the first redistribution layers and the connection pads to each other; a passivation layer, disposed on a lowermost one of the first insulating layers, embedding a lowermost one of the first redistribution layers, and having openings exposing portions of the lowermost one of the first redistribution layers; a second redistribution layer disposed on the encapsulant; a second insulating layer disposed on the encapsulant and embedding the second redistribution layer; and a heat dissipation layer embedded in one of the second insulating layer or the passivation layer, and having a surface exposed from the one of the second insulating layer or the passivation layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
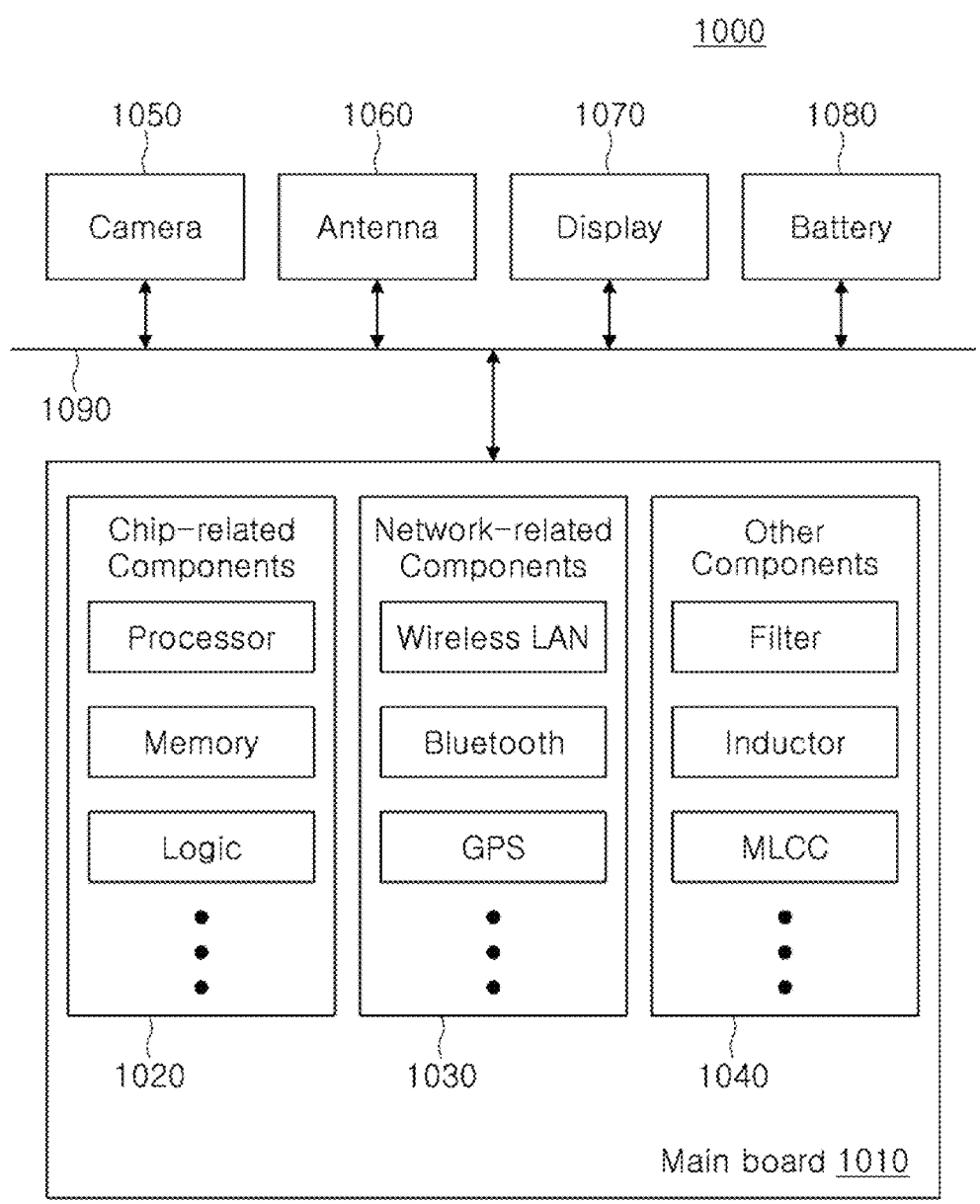
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically and/or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
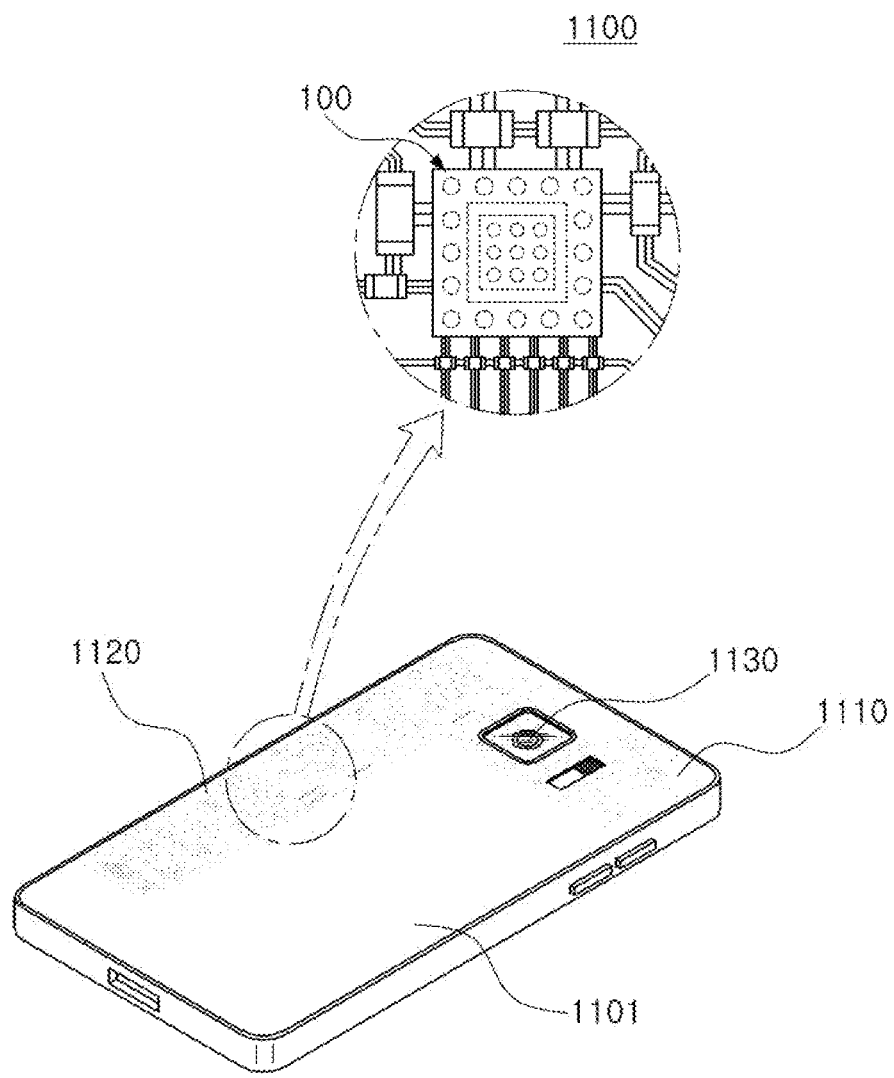
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, aprinted circuit board 1110 such as a main board or the like may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3:
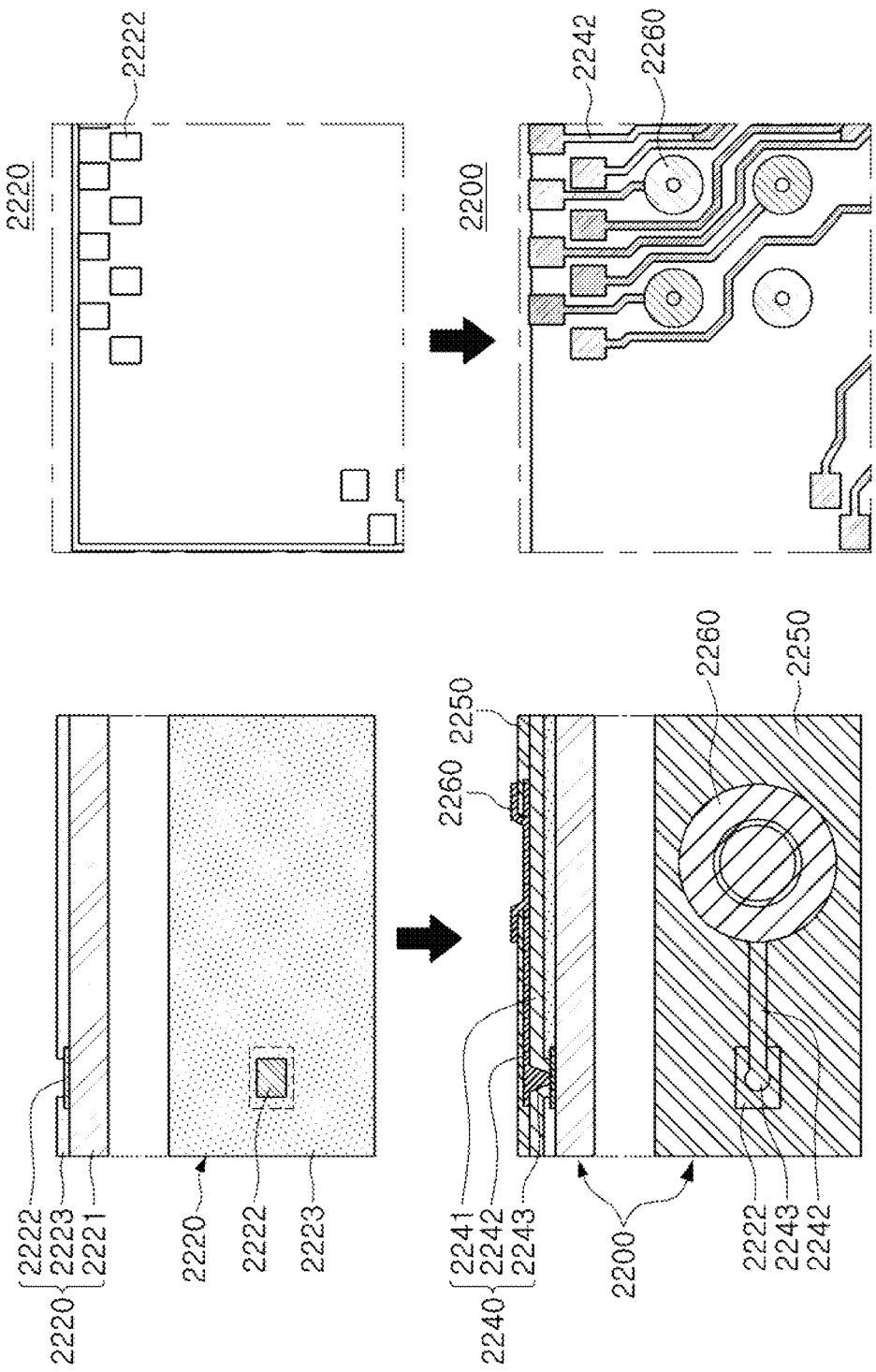
FIGS. 3A and 3B are schematic cross-sectional views illustrating states of a fan-in semiconductor package before and after being packaged.

FIGS. 3A and 3B are schematic cross-sectional views illustrating states of a fan-in semiconductor package before and after being packaged.

Figure 4:
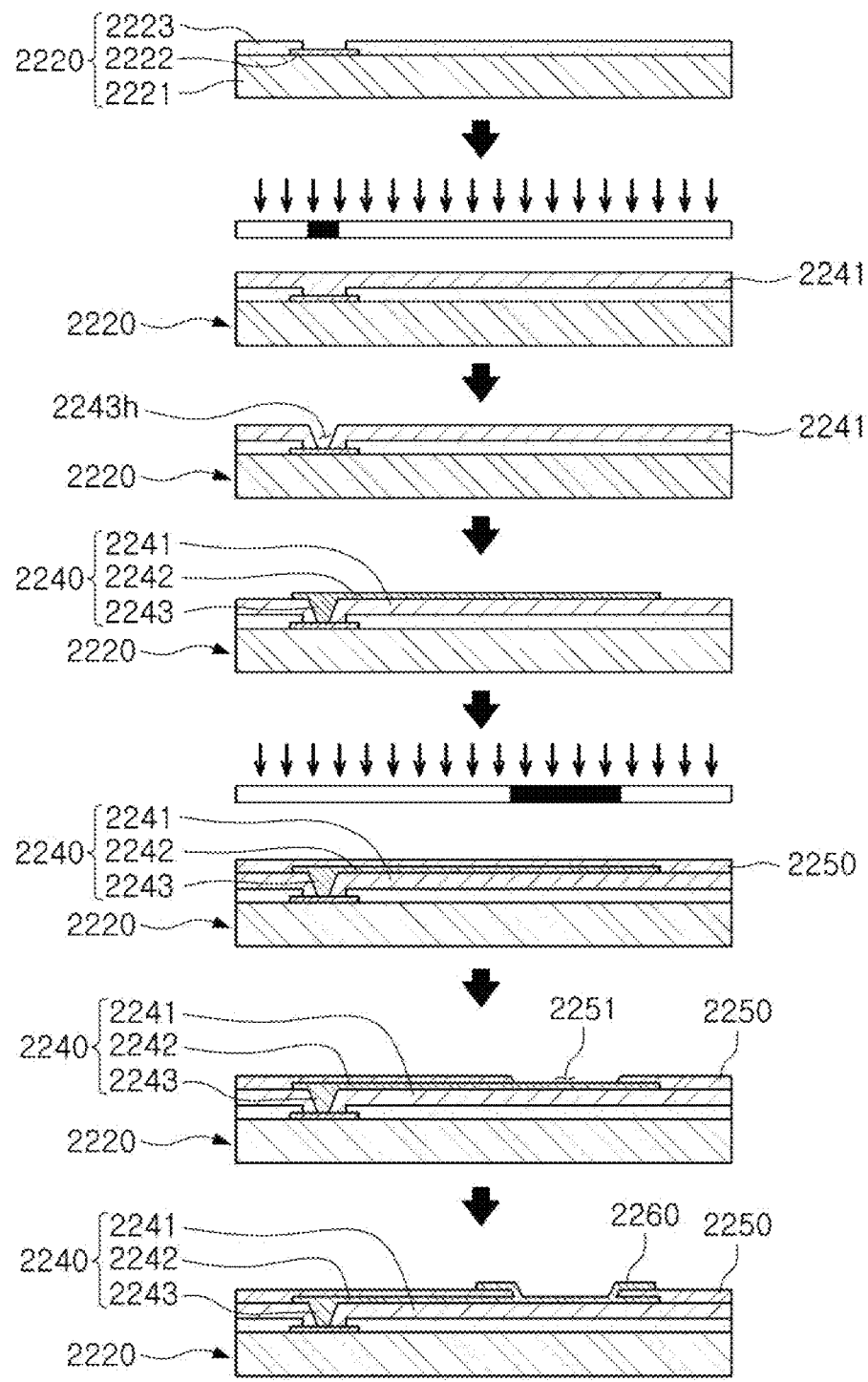
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as photo imagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal bump layer 2260, or the like, may be formed. That is, a fan-in semiconductor package 2200 including, for example, the semiconductor chip 2220, the connection structure 2240, the passivation layer 2250, and the underbump metal bump layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
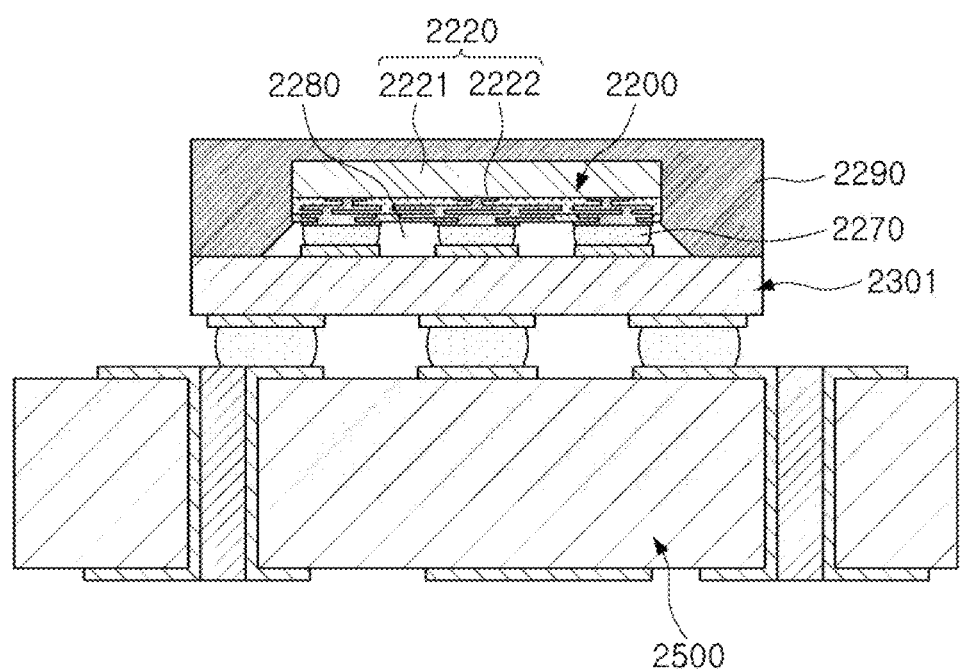
FIG. 5 is a schematic cross-sectional view illustrating a case in which a fan-in semiconductor package is mounted on a printed circuit board and is finally mounted on a main board of an electronic device.

FIG. 5 is a schematic cross-sectional view illustrating a case in which a fan-in semiconductor package is mounted on a printed circuit board and is finally mounted on a main board of an electronic device.

Figure 6:
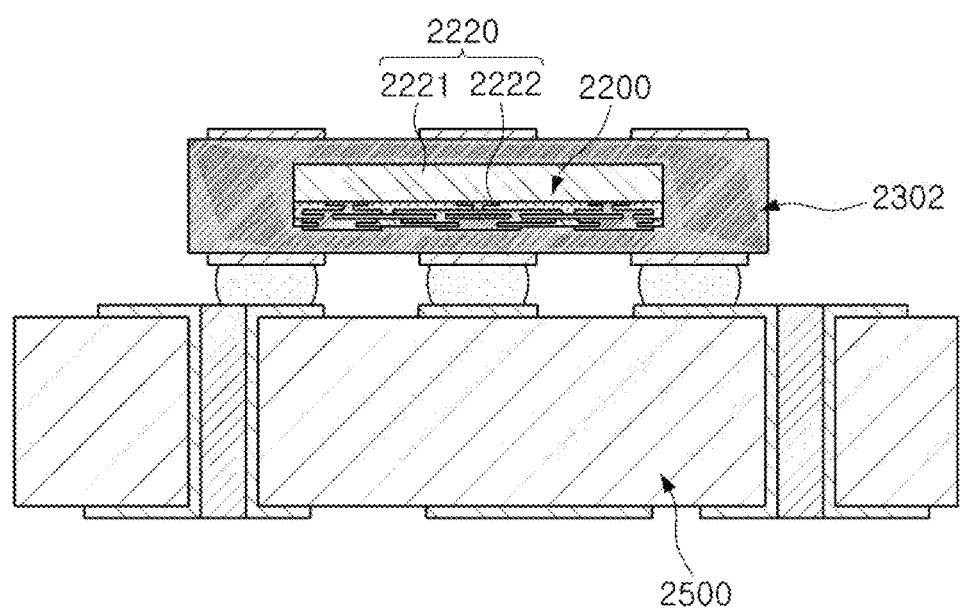
FIG. 6 is a schematic cross-sectional view illustrating a case in which a fan-in semiconductor package is embedded in a printed circuit board and is finally mounted on a main board of an electronic device.

FIG. 6 is a schematic cross-sectional view illustrating a case in which a fan-in semiconductor package is embedded in a printed circuit board and is finally mounted on a main board of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be finally mounted on a main board 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate printed circuit board and be then mounted on the main board of the electronic device through a packaging process or may be mounted and used on the main board of the electronic device in a state in which it is embedded in the printed circuit board.

Fan-Out Semiconductor Package

Figure 7:
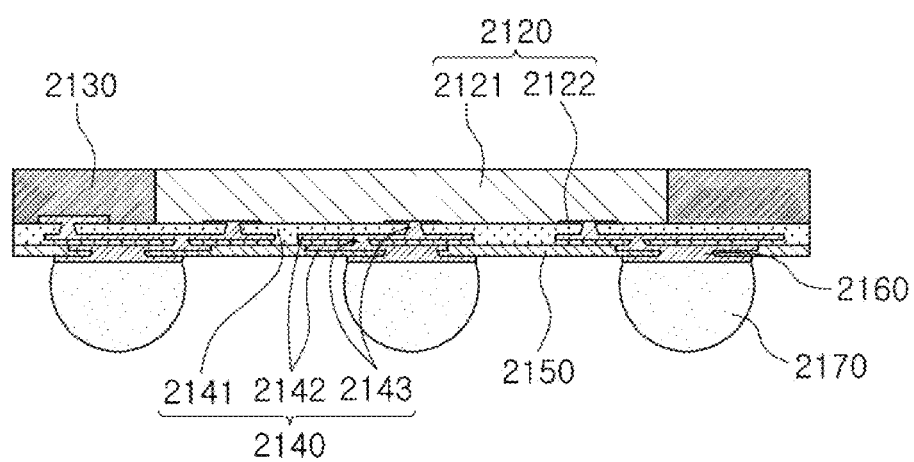
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. Here, a passivation layer 2150 may be further formed on the connection structure 2140, and underbump metal bump layers 2160 may be further formed in openings of the passivation layer 2150. Solder balls 2170 may further be formed on the underbump metal bump layer 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2241, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate printed circuit board, as described below.

Figure 8:
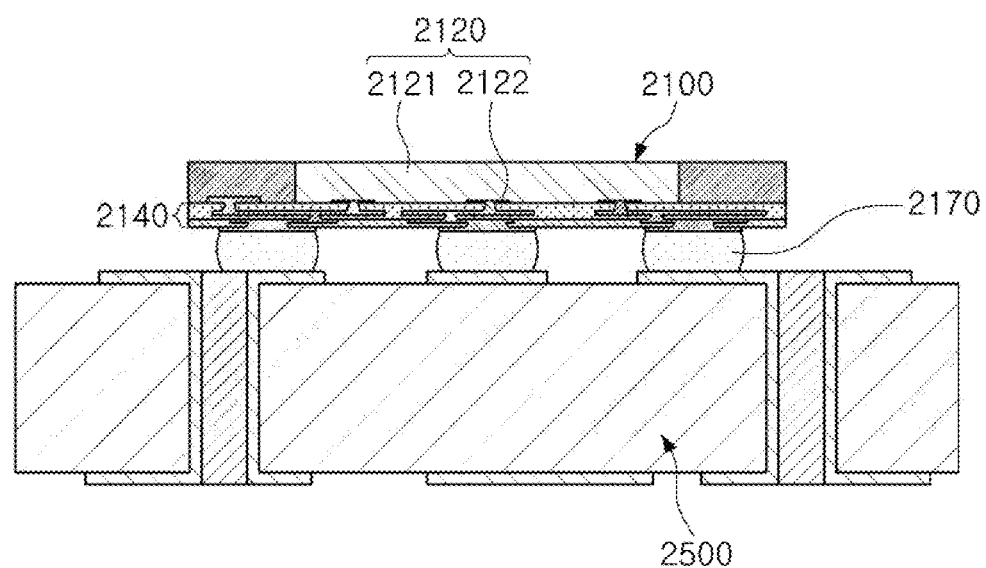
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a printed circuit board, or the like.

As described above, since the fan-out semiconductor package may be mounted on the main board of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

Hereinafter, a semiconductor package of a new structure capable of significantly reducing a mounting area of a semiconductor chip and a passive component, significantly reducing an electrical path between the semiconductor chip and the passive component, significantly reducing a process defect such as undulation or crack, and easily connecting electrodes of the passive component with connection vias by a laser-via hole machining will be described with reference to the accompanying drawings.

Figure 9:
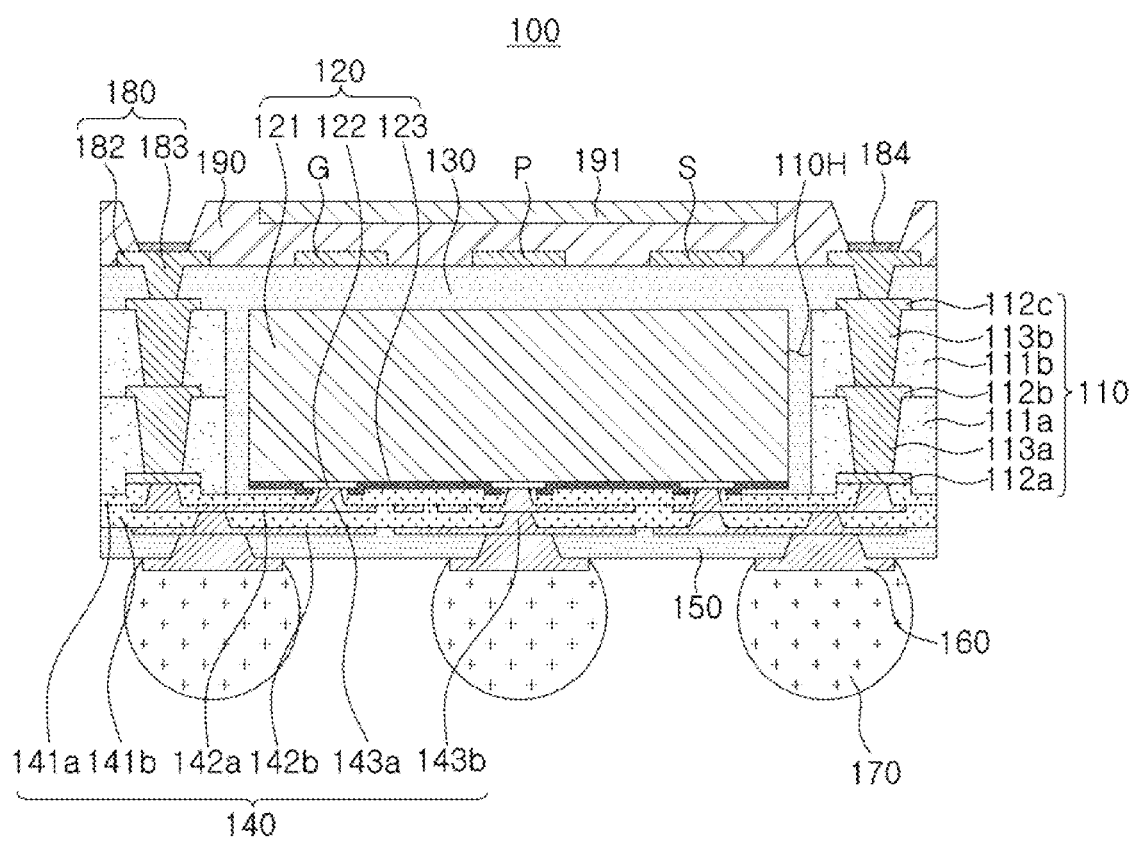
FIG. 9 is a schematic cross-sectional view illustrating an example of a semiconductor package.
Figure 10:
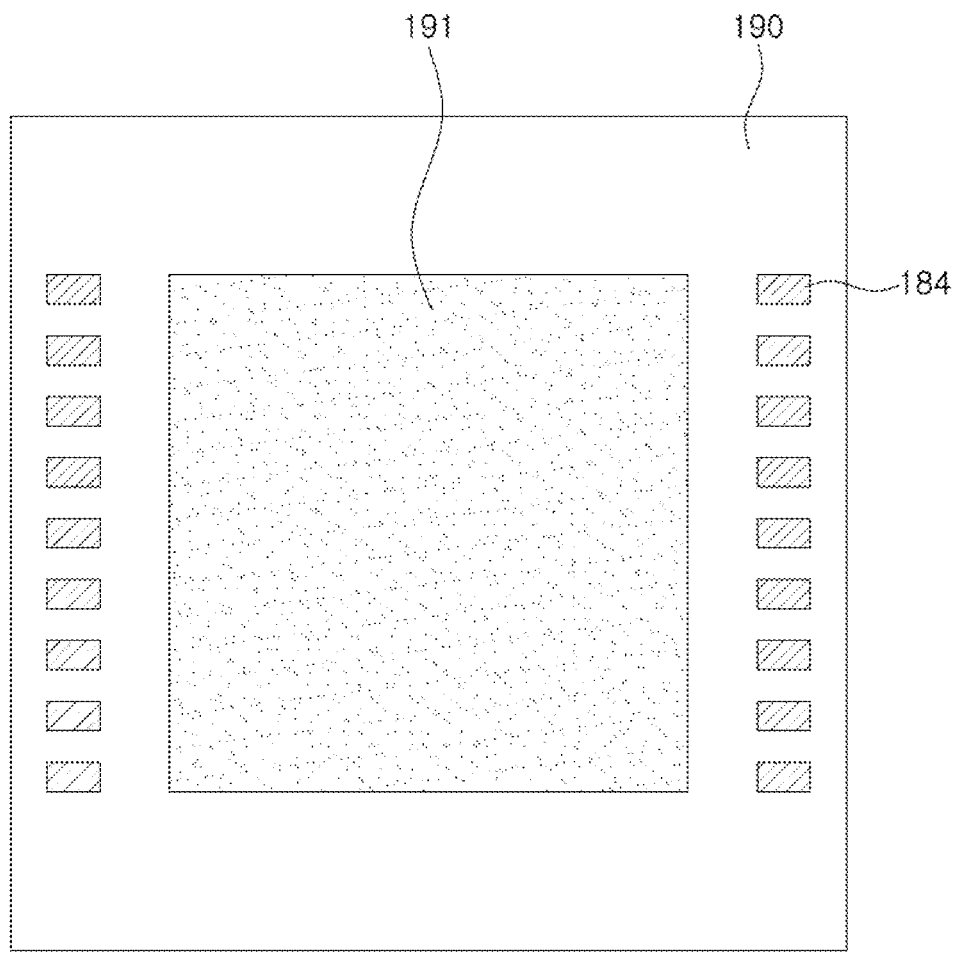
FIGS. 10 and 11A-11B are plan views of the semiconductor package of FIG. 9 when viewed from above and illustrate a heat dissipation layer as a main component.

FIG. 9 is a schematic cross-sectional view illustrating an example of a semiconductor package. FIGS. 10 and 11 are plan views of the semiconductor package of FIG. 9 when viewed from above and illustrate a heat dissipation layer as a main component. FIGS. 12 through 17 illustrate a semiconductor package according to a modified example.

First, referring to FIGS. 9 and 10, a semiconductor package 100 according to an example may include a connection structure 140, a semiconductor chip 120, an encapsulant 130, an insulating layer 190, a redistribution layer 182, and a heat dissipation layer 191. In addition to the components described above, the semiconductor package 100 may further include a frame 110, a passivation layer 150, underbump metal bumps 160, electrical connection metals 170, and the like.

The frame 110, which is an additional component, may improve rigidity of the semiconductor package 100 depending on certain materials of build-up layers 111a and 111b, and serves to secure uniformity of a thickness of the encapsulant 130. The frame 110 may have a through-hole 110H penetrating through the build-up layers 111a and 111b. The semiconductor chip 120 may be disposed in the through-hole 110H and a passive component (not shown) may also be disposed together therein if necessary. The through-hole 110H may be formed so that a wall surface thereof surrounds the semiconductor chip 120, but is not necessarily limited thereto. The frame 110 may include wiring layers 112a, 112b, and 112c, and wiring vias 113a and 113b, in addition to the build-up layers 111a and 111b, and may thus serve as the connection structure. In this case, the wiring layers 112a, 112b, and 112c and the wiring vias 113a and 113b may serve as electrical connection members. If necessary, a connection structure having electrical connection members capable of providing another type of vertically electrical connection path instead of the frame 110 may be disposed.

The frame 110 may include a first build-up layer 111a in contact with the connection structure 140, a first wiring layer 112a in contact with the connection structure 140 and embedded in the first build-up layer 111a, a second wiring layer 112b disposed on the other surface of the first build-up layer 111a opposing one surface of the first build-up layer 111a in which the first wiring layer 112a is embedded, a second build-up layer 111b disposed on the first build-up layer 111a and covering at least a portion of the second wiring layer 112b, and a third wiring layer 112c disposed on the other surface of the second build-up layer 111b opposing one surface of the second build-up layer 111b in which the second wiring layer 112b is embedded. The first and second wiring layers 112a and 112b and the second and third wiring layers 112b and 112c may be electrically connected to each other through first and second wiring vias 113a and 113b penetrating through the first and second build-up layers 111a and 111b, respectively. The first to third wiring layers 112a, 112b, and 112c may be electrically connected to connection pads 122 through first redistribution layers 142a and 142b of the connection structure 140.

A material of each of the build-up layers 111a and 111b is not particularly limited. For example, an insulating material may be used as the material of the build-up layers 111a and 111b. In this case, a thermosetting resin such as an epoxy resin, a thermoplastic resin such as polyimide, a resin in which the thermosetting resin and the thermoplastic resin are mixed with an inorganic filler, for example, an Ajinomoto Build-up Film (ABF), or the like, may be used as the insulating material. Alternatively, a material in which the above-mentioned resins are impregnated together with inorganic filler in a core material such as a glass fiber (a glass cloth or a glass fabric), for example, prepreg, or the like, may also be used as the insulating material.

The wiring layers 112a, 112b, and 112c may provide a vertical electrical connection path of the semiconductor package 100 together with the wiring vias 113a and 113b, and may serve to redistribute the connection pads 122. A material of each of the wiring layers 112a, 112b, and 112c may be a metal material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of their corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, electrical connection metal pads, and the like. The wiring layers 112a, 112b, and 112c may be formed by a known plating process, and may each include a seed layer and a conductor layer.

A thickness of each of the wiring layers 112a, 112b, and 112c may be greater than that of each of the redistribution layers 142a and 142b. Specifically, the frame 110 may have a thickness greater than that of the semiconductor chip 120, and in order to maintain rigidity, the prepreg, or the like may be selected as a material of each of the build-up layers 111a and 111b. Therefore, the thickness of each of the formed wiring layers 112a, 112b, and 112c may be relatively thick. On the other hand, the connection structure 140 may require a fine circuit and a high-density design, and a photo imagable dielectric (PID) material may be selected as a material of each of the first insulating layers 141a and 141b. Therefore, a thickness of each of the formed first redistribution layers 142a and 142b may be relatively thin.

The first wiring layer 112a may be recessed into the first build-up layer 111a. As described above, in a case in which the first wiring layer 112a is recessed into the first build-up layer 111a, such that a surface of the first build-up layer 111a which is in contact with the connection structure 140 and a surface of the first wiring layer 112a which is in contact with the connection structure 140 have a step therebetween, when the semiconductor chip 120 and the frame 110 are encapsulated with the encapsulant 130, a phenomenon in which a forming material bleeds to pollute the first wiring layer 112a may be prevented.

The wiring vias 113a and 113b may electrically connect the wiring layers 112a, 112b, and 112c formed on different layers to each other, resulting in an electrical path in the frame 110. A material of each of the wiring vias 113a and 113b may be a metal material such as copper (Cu), aluminum (Al), silver (Ag), tin (Sn), gold (Au), nickel (Ni), lead (Pb), titanium (Ti), or alloys thereof. Each of the wiring vias 113a and 113b may also be a field type via filled with ametal material, and may also be a conformal type via in which the metal material is formed along a wall surface of a via hole. In addition, each of the wiring vias may have a tapered shape. The wiring vias 113a and 113b may also be formed by a plating process, and may each include a seed layer and a conductor layer.

When a hole for the first wiring via 113a is formed, some of the pads of the first wiring layer 112a may serve as a stopper, and it may thus be advantageous in a process that the first wiring via 113a has the tapered shape of which a width of an upper surface is greater than that of a lower surface. In this case, the first wiring via 113a may be integrated with pad patterns of the second wiring layer 112b. In addition, when a hole for the second wiring via 113b is formed, some of the pads of the second wiring layer 112b may serve as a stopper, and it may thus be advantageous in a process that the second wiring via 113b has the tapered shape of which a width of an upper surface is greater than that of a lower surface. In this case, the second wiring via 113b may be integrated with pad patterns of the third wiring layer 112c.

Meanwhile, although not illustrated in the drawings, if necessary, a metal layer (not shown) may also be disposed on the wall surfaces of the through-hole 110H of the frame 110, in order to block electromagnetic waves or to dissipate heat, and the metal layer (not shown) may surround the semiconductor chip 120.

The semiconductor chip 120 may be an integrated circuit (IC) provided in an amount of several hundreds to several millions or more elements integrated in a single chip. In this case, the IC may be, for example, an application processor chip such as a central processor (for example, a CPU), a graphic processor (for example, a GPU), a digital signal processor, a cryptographic processor, a microprocessor, a micro controller, or the like, but is not limited thereto. For example, the IC may also be a memory chip such as a power management IC (PMIC), a volatile memory (for example, a DRAM), a non-volatile memory (for example, a ROM), a flash memory, or the like, or a logic chip such as an analog-to-digital converter, an application-specific IC (ASIC), or the like.

The semiconductor chip 120 may be an integrated circuit in a bare state in which a separate bump or wiring layer is not formed. However, the semiconductor chip 120 is not limited thereto, but may also be a packaged type IC if necessary. The integrated circuit may be formed on the basis of an active wafer. In this case, abase material of the body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a metal material such as aluminum (Al), or the like without being particularly limited. A passivation layer 123 opening the connection pads 122 may be formed on the body 121, and may be an oxide film, a nitride film, or the like, or a double layer of the oxide film and the nitride film. An insulating layer (not shown), and the like, may be further disposed in other required positions. Meanwhile, a surface of the semiconductor chip 120 on which the connection pads 122 are disposed may be an active surface, and a surface of the semiconductor chip 120 opposing the active surface may be an inactive surface. In this case, when the passivation layer 123 is formed on the active surface of the semiconductor chip 120, the active surface of the semiconductor chip 120 may determine a positional relationship based on the lowest surface of the passivation layer 123.

The encapsulant 130 may cover at least a portion of the semiconductor chip 120, and may encapsulate the frame 110 and the semiconductor chip 120 as shown. In addition, the encapsulant 130 may fill at least a portion of the through-hole 110H. The encapsulant 130 may include an insulating material, and the insulating material may be a material including an inorganic filler and an insulating resin, for example, a thermosetting resin such as an epoxy resin, a thermoplastic resin such as polyimide, a resin having a reinforcing material such as an inorganic filler impregnated in the thermosetting resin and the thermoplastic resin, such as Ajinomoto Build up Film (ABF), FR-4, Bismaleimide Triazine (BT) resin, or the like. In addition, a molding material such as an epoxy molding compound (EMC) may be used, and a photo imagable dielectric material, that is, a photo imagable encapsulant (PIE) may also be used, if necessary. If necessary, a material in which an insulating resin such as a thermosetting resin or a thermoplastic resin is impregnated in inorganic filler and/or a core material such as a glass fiber (a glass cloth or a glass fabric) may also be used as the insulating material.

The connection structure 140 may redistribute the connection pads 122 of the semiconductor chip 120. Several tens to several hundreds of connection pads 122 of the semiconductor chip 120 having various functions may be redistributed by the connection structure 140, and may be physically and/or electrically externally connected through the electrical connection metals 170 depending on the functions. The connection structure 140 may include first insulating layers 141a and 141b, first redistribution layers 142a and 142b disposed on the first insulating layers 141a and 141b, and first connection vias 143a and 143b penetrating through the first insulating layers 141a and 141b and electrically connecting the connection pads 122 and the first redistribution layers 142a and 142b to each other. The components of the connection structure 140 may be more or less than those shown in the drawings.

An insulating material may be used as a material of each of the first insulating layers 141a and 141b. In this case, the insulating material may be a photo imagable dielectric (PID) material. In this case, a fine pitch may also be introduced through a photo via, which is advantageous for a fine circuit and a high-density design, such that several hundreds to several millions of connection pads 122 of the semiconductor chip 120 may be very effectively redistributed. The first insulating layers 141a and 141b may be bounded to each other or may also have boundaries which are unclear.

The first redistribution layers 142a and 142b may redistribute the connection pads 122 of the semiconductor chip 120 to electrically connect the connection pads 122 to the electrical connection metals 170. A material of each of the first redistribution layers 142a and 142b may also be a metal material such as copper (Cu), aluminum (Al), silver (Ag), tin (Sn), gold (Au), nickel (Ni), lead (Pb), titanium (Ti), or alloys thereof. The redistribution layers 142a and 142b may also perform various functions depending on designs thereof. For example, the redistribution layers 142a and 142b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142a and 142b may include via pads, electrical connection metal pads, and the like.

The first connection vias 143a and 143b may electrically connect the first redistribution layers 142a and 142b formed on different layers to each other, and may also electrically connect the connection pads 122 of the semiconductor chip 120 to the first redistribution layers 142a and 142b. The first connection vias 143a may be in physical contact with the connection pads 122 when the semiconductor chip 120 is a bare die. A material of each of the first connection vias 143a and 143b may be similarly a metal material such as copper (Cu), aluminum (Al), silver (Ag), tin (Sn), gold (Au), nickel (Ni), lead (Pb), titanium (Ti), or alloys thereof. Each of the connection vias 143a and 143b may also be a field type via filled with a metal material, and may also be a conformal type via in which the metal material is formed along a wall surface of a via hole. In addition, each of the connection vias 143a and 143b may have a tapered shape in a direction opposite to that of the wiring vias 113a and 113b. The first connection vias 143a and 143b may also be formed by a plating process, and may each include a seed layer and a conductor layer.

The passivation layer 150 may be additionally configured to protect the connection structure 140 from external physical or chemical damage. The passivation layer 150 may include a thermosetting resin. For example, the passivation layer 150 may be formed of ABF, but is not limited thereto. The passivation layer 150 may have the openings opening at least portions of the redistribution layer 142b. The openings may be provided in an amount of several tens to several thousands, and may also be provided in an amount of several tens to several thousands or more or several tens to several thousands or less.

The underbump metal bumps 160 may also be additional configurations and improve connection reliability of the electrical connection metals 170 to improve board level reliability of the fan-out semiconductor package 100 according to an example. The underbump metal bumps 160 may be provided in an amount of several tens to several thousands, and may also be provided in an amount of several tens to several thousands or more or several tens to several thousands or less. Each of the underbump metal bumps 160 may be connected to the redistribution layer 142b which is formed in the opening and is opened. The underbump metal bumps 160 may be formed by the known metallization method using a metal, but is not limited thereto.

The electrical connection metals 170 may also be additional configurations and physically and/or electrically externally connect the semiconductor package 100. For example, the semiconductor package 100 may be mounted on the main board of the electronic device through the electrical connection metals 170. The electrical connection metals 170 may be formed of a low-melting point metal, for example, tin (Sn) or an alloy containing tin (Sn). More specifically, the electrical connection metals 170 may be formed of a solder, or the like. However, this is only an example, and a material of each of the electrical connection metals 170 is not particularly limited thereto.

Each of the electrical connection metals 170 may be a land, a ball, a pin, or the like. The electrical connection metals 170 may be formed as a multilayer or single layer structure. When the electrical connection metals 170 are formed as a multilayer structure, the electrical connection metals 170 may include a copper (Cu) pillar and a solder. When the electrical connection metals 170 are formed as a single layer structure, the electrical connection metals 170 may include a tin-silver solder or copper (Cu). However, this is only an example, and the electrical connection metals 170 are not limited thereto. The number, an interval, a disposition form, and the like, of electrical connection metals 170 are not particularly limited, but may be sufficiently modified depending on design particulars by those skilled in the art. For example, the electrical connection metals 170 may be provided in an amount of several tens to several thousands according to the number of connection pads 122, or may also be provided in an amount of several tens to several thousands or more or several tens to several thousands or less.

At least one of the electrical connection metals 170 may be disposed in a fan-out region. The fan-out region is a region except for a region in which the semiconductor chip 120 is disposed. The fan-out package may have reliability greater than that of a fan-in package, may implement a plurality of I/O terminals, and may easily perform 3D interconnection. In addition, as compared to a ball grid array (BGA) package, a land grid array (LGA) package, or the like, the fan-out package may be manufactured to have a small thickness, and may have price competitiveness.

The second insulating layer 190 disposed on the encapsulant 130 may be configured to protect a backside structure 180 from external physical or chemical damage. Here, the backside structure 180 may include the second redistribution layer 182 and connection vias 183 penetrating through the encapsulant 130. Specifically, the second redistribution layer 182 may be disposed on the encapsulant 130, and may be disposed in the second insulating layer 190, for example. The second redistribution layer 182 may include a metal material such as copper (Cu), aluminum (Al), silver (Ag), tin (Sn), gold (Au), nickel (Ni), lead (Pb), titanium (Ti), or alloys thereof. The second redistribution layer 182 may perform various functions depending on a design. For example, the second redistribution layer 182 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second redistribution layer 182 may include via pads, wire pads, electrical connection metal pads, and the like.

The connection vias 183 may penetrate through the encapsulant 130, and electrically connect the second redistribution layer 182 and the third wiring layer 112c of the frame 110 to each other. Each of the connection vias 183 may also include a metal material such as copper (Cu), aluminum (Al), silver (Ag), tin (Sn), gold (Au), nickel (Ni), lead (Pb), titanium (Ti), or alloys thereof. Each of the backside connection vias 183 may also be a field type via filled with a metal material, and may also be a conformal type via in which the metal material is formed along a wall surface of a via hole. In addition, each of the backside connection vias 183 may have a tapered shape tapered in the same direction as that of the wiring vias 113a and 113b.

The second insulating layer 190 may include a thermosetting resin. For example, the second insulating layer 190 may be formed of ABF, but is not limited thereto. The second insulating layer 190 may have openings exposing portions of the second redistribution layer 182. Such openings may be provided in an amount of several tens to several thousands, and may also be provided in an amount of several tens to several thousands or more or several tens to several thousands or less. A surface treatment layer 184 may be formed on a surface of an exposed region of the second redistribution layer 182 which is not covered by the second insulating layer 190 and is exposed by the openings, if necessary, and the surface treatment layer 184 may be a known plating layer such as nickel (Ni)/gold (Au).

A heat dissipation layer 191 may be disposed on the encapsulant 130, and may be disposed in the second insulating layer 190 as shown. The heat dissipation layer 191 may be disposed on the second redistribution layer 182, and may also embedded in the second insulating layer 190 and an upper surface thereof may be exposed externally of the second insulating layer 190, thereby improving a heat dissipation effect. Any material may be used as a material of the heat dissipation layer 191 as long as it is a material having high thermal conductivity, and for example, metals such as Ag, Cu, and Ni, materials containing metals such as Ag, Cu, and Ni, or carbon components, composites of these materials, and the like may be used. In this case, the heat dissipation layer 191 may have a plate or plate-like shape. In addition, a portion of the second redistribution layer 182 may be disposed in a region in which the heat dissipation layer 191 and the semiconductor chip 120 overlap in a thickness direction.

In the present exemplary embodiment, the heat dissipation layer 191 may be electrically insulated from signal lines S of the second redistribution layer 182. Therefore, the heat dissipation layer 191 may perform a heat dissipation function without affecting the signal lines S of the second redistribution layer 182. In addition, unlike a conventional heat dissipation means which is additionally provided, for example, a heat dissipation adhesive layer, a heat sink, or the like, the heat dissipation layer 191 may be embedded in the second insulating layer 190 and may also be disposed in a dummy region of the second insulating layer 190. Therefore, effective heat dissipation efficiency may be implemented without an additional heat dissipation structure, and a thickness of the semiconductor package 100 may be reduced. Here, the dummy region of the second insulating layer 190 may refer to a region in which the signal lines, the ground lines, the power lines, and the like are not disposed, and the heat dissipation layer 191 may improve space efficiency of the semiconductor package 100.

Figure 11A:
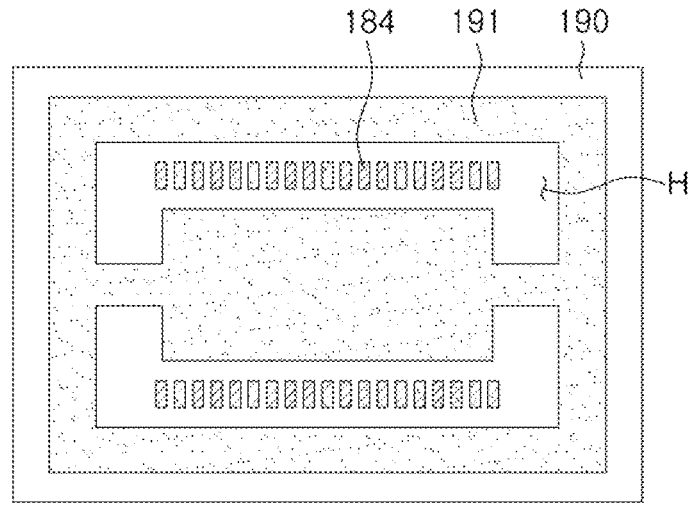
Figure 11B:
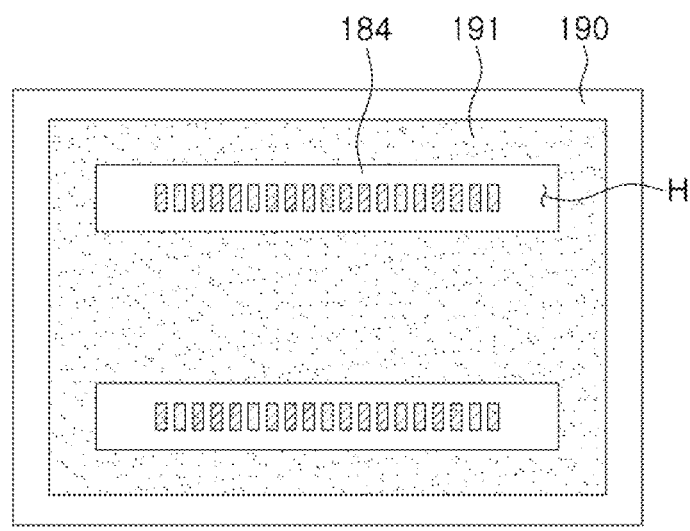

The heat dissipation layer 191 of FIG. 10 illustrates an arrangement form of an exposed region of the second redistribution layer 182, which is based on a state in which the surface treatment layer 184 is formed in the exposed region. As described above, the heat dissipation layer 191 may be disposed to be separated from the exposed region of the second redistribution layer 182, and may be further electrically insulated from the signal lines S of the second redistribution layer 182. In this case, the exposed region (covered by the surface treatment layer 184) of the second redistribution layer 182 may have a plurality of pattern shapes spaced apart from each other when viewed from above. In addition, the heat dissipation layer 191 and the second redistribution layer 182 may be modified as shown in FIGS. 11A and 11B so as to more efficiently use a space in which the heat dissipation layer 191 is disposed. Specifically, the exposed region of the second redistribution layer 182 may have a form surrounded by the heat dissipation layer 191 when viewed from above, and to this end, the heat dissipation layer 191 may have the through-hole H, in which the exposed regions (covered by the surface treatment layers 184) of the second redistribution layer 182 are disposed.

Figure 12:
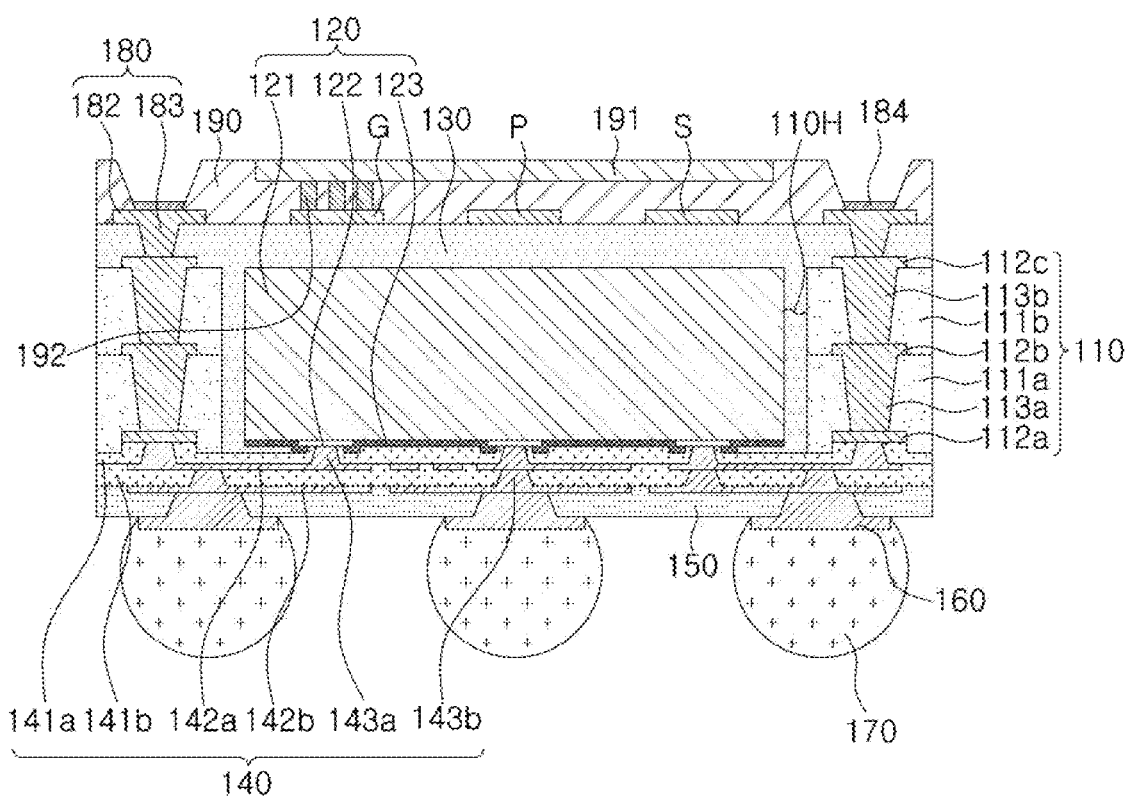
FIGS. 12 through 17 illustrate a semiconductor package according to a modified example.

A semiconductor package according to a modified example shown in FIG. 12 may include a connection relationship of the ground lines G included in the second redistribution layer 182 and the heat dissipation layer 191. Specifically, the heat dissipation layer 191 may be electrically connected to the ground lines G and may also be physically connected thereto. For such an electrical and physical connection, the heat dissipation layer 191 and the ground lines G may be connected to each other by the connection vias 192 penetrating through the second insulating layer 190. As in the present exemplary embodiment, the heat dissipation layer 191 may be connected to the ground lines G, thereby further improving a heat dissipation performance and further effectively protecting the semiconductor chip 120, or the like from electromagnetic wave interference.

Figure 13:
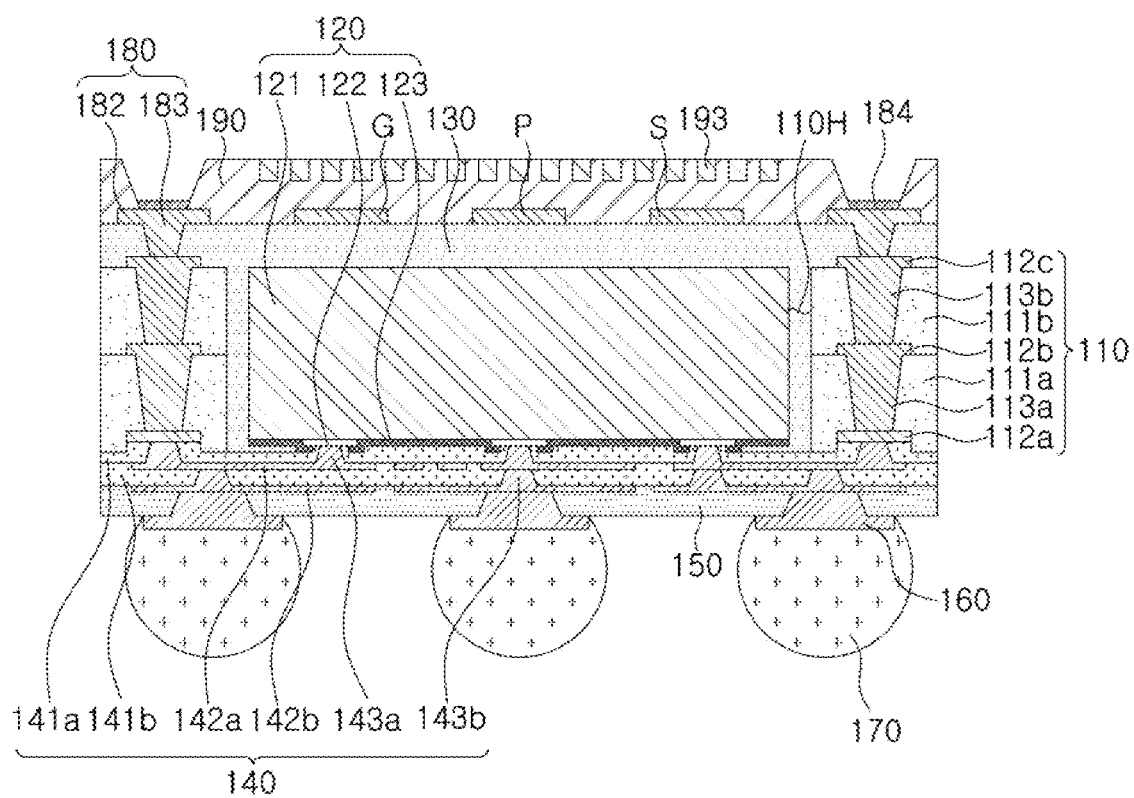
Figure 14:
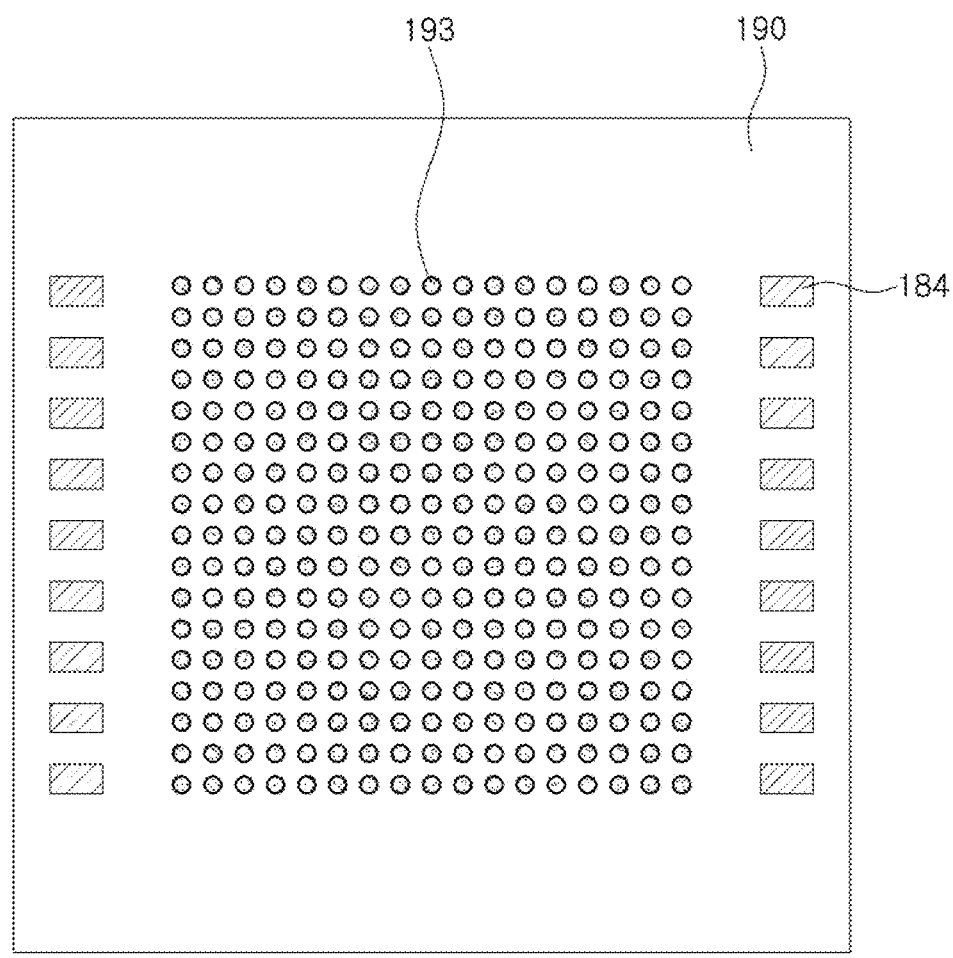

In addition, the exemplary embodiment described above illustrates an example in which the heat dissipation layer 191 has the plate shape, but the shape of the heat dissipation layer 191 may be modified. As shown in FIG. 13 and FIG. 14 which is a plan view of a semiconductor package of FIG. 13 when viewed from above and illustrates a heat dissipation layer as a main component, a heat dissipation layer 193 may have a shape of a plurality of heat dissipation vias.

Figure 15:
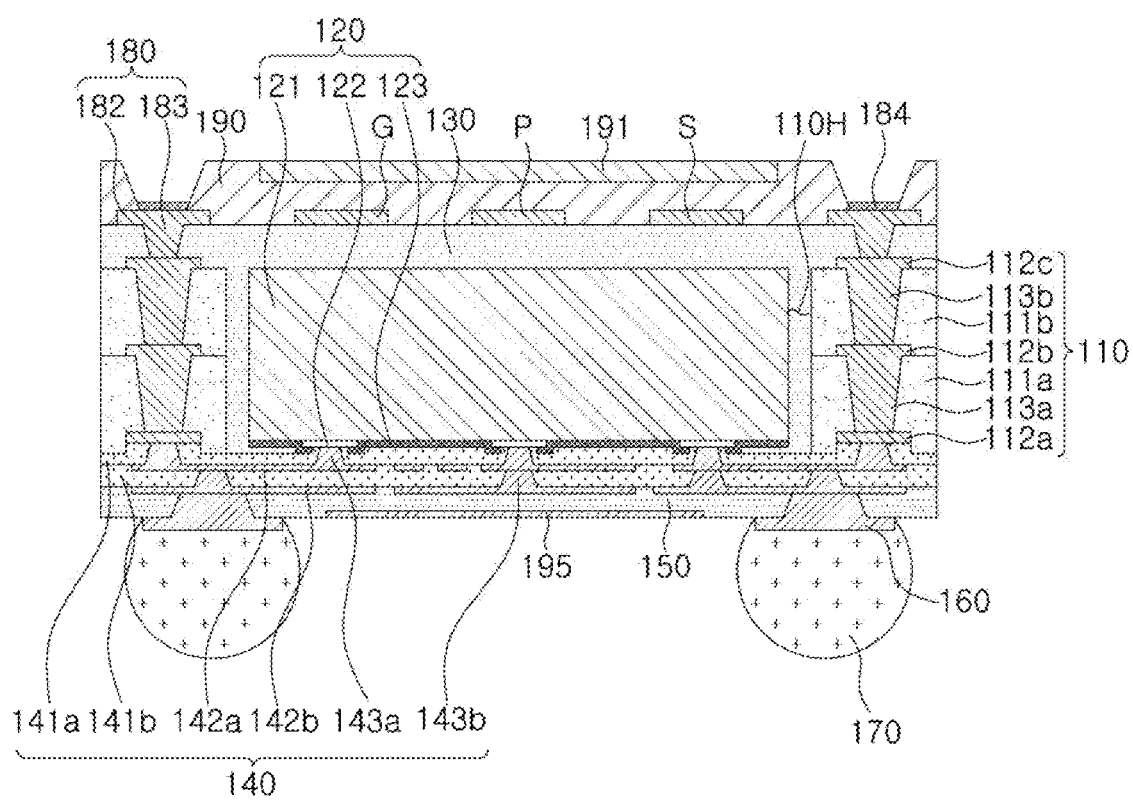
Figure 16A:
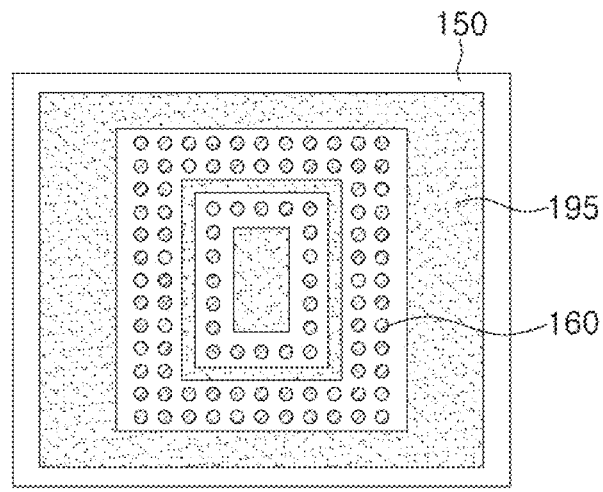
Figure 16B:
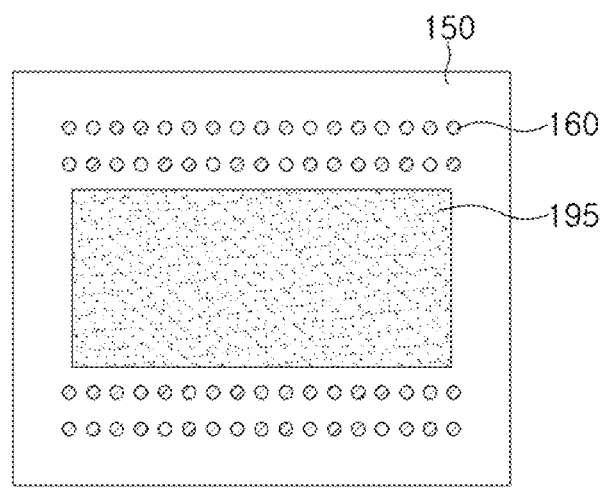

An example in which an additional heat dissipation layer is disposed below the package will be described with reference to FIG. 15 and FIGS. 16A and 16B which are plan views of a semiconductor package of FIG. 15 when viewed from below and illustrate an additional heat dissipation layer as a main component. As shown in FIGS. 15, 16A, and 16B, an additional heat dissipation layer 195 may be disposed below the connection structure 140, and as a result, the heat dissipation efficiency of the package may be further improved. The additional heat dissipation layer 195 may be embedded in the passivation layer 150 disposed below the connection structure 140 so as to improve the heat dissipation performance, and a lower surface of the additional heat dissipation layer 195 may be exposed from the passivation layer 150. Similarly to the upper heat dissipation layer 191, the additional heat dissipation layer 195 may be disposed in the dummy region without being connected to the first redistribution layers 142a and 142b of the connection structure 140, the underbump metal bump 160, or the like. In this case, as shown in FIG. 16A, the underbump metal bump 160 may have a form surrounded by the additional heat dissipation layer 191 when viewed from below. Alternately, as shown in FIG. 16B, the additional heat dissipation layer 195 may be disposed at the center of the passivation layer 150 and the underbump metal bump 160 may be disposed on an outer portion of the passivation layer 150.

Figure 17:
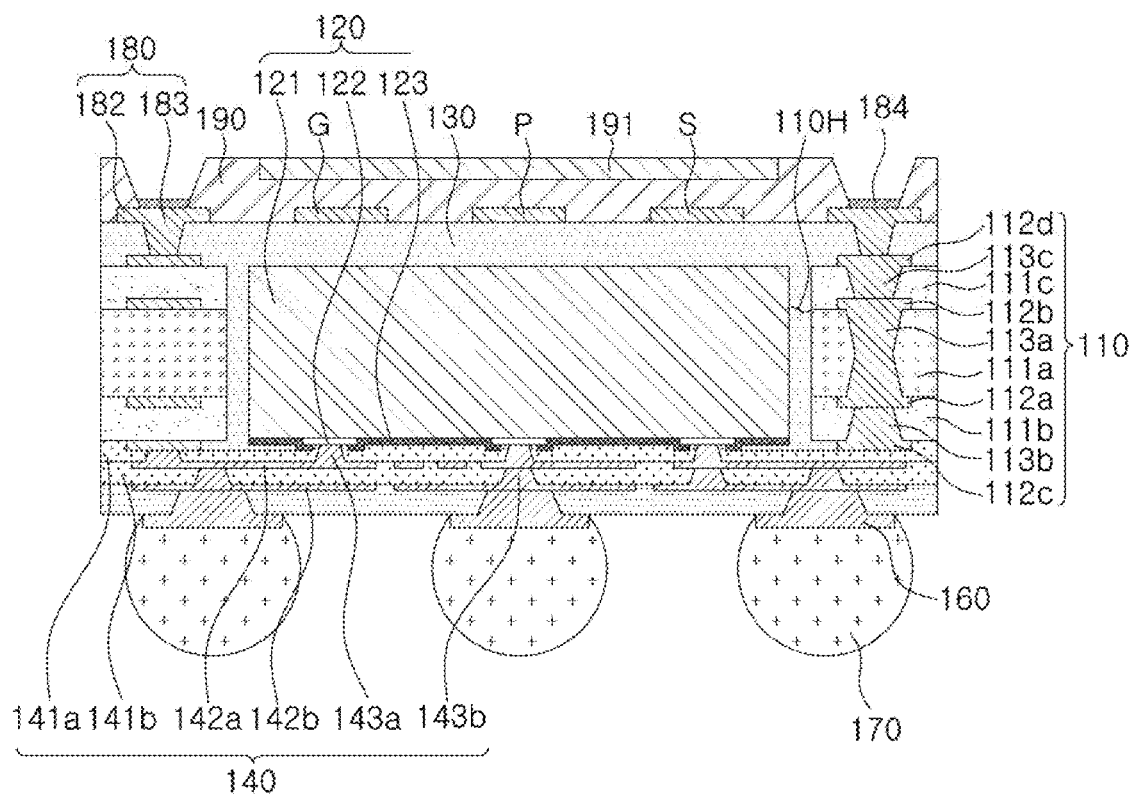

A modified example of FIG. 17 will be described. In FIG. 17, the frame 110 may have a different form as compared to the exemplary embodiment described above. Only modified portions will be described and a description of an overlapped portion will be omitted. The frame 110 may include a core layer 111a, a first wiring layer 112a and a second wiring layer 112b disposed on opposite surfaces of the core layer 111a, respectively, a first build-up layer 111b and a second build-up layer 111c disposed on the opposite surfaces of the core layer 111a, respectively, and covering the first and wiring layers 112a and 112b, respectively, a third wiring layer 112c disposed on the other surface of the first build-up layer 111b opposing one surface of the first build-up layer 111b in which the first wiring layer 112a is embedded, a fourth wiring layer 112d disposed on the other surface of the second build-up layer 111c opposing one surface of the second build-up layer 111c in which the second wiring layer 112b is embedded, a first wiring via 113a penetrating through the core layer 111a and electrically connecting the first and second wiring layers 112a and 112b to each other, a second wiring via 113b penetrating through the first build-up layer 111b and electrically connecting the first and third wiring layers 112a and 112c, and a third wiring via 113c penetrating through the second build-up layer 111c and electrically connecting the second and fourth wiring layers 112b and 112d. Since the frame 110 may include a large number of wiring layers 112a, 112b, 112c, and 112d, a connection structure 140 may be further simplified.

The core layer 111a may have a thickness greater than those of the first build-up layer 111b and the second build-up layer 111c. The core layer 111a may be relatively thick in order to basically maintain rigidity, and the first build-up layer 111b and the second build-up layer 111c may be introduced in order to form a larger number of wiring layers 112c and 112d. Similarly, the first wiring via 113a penetrating through the core layer 111a may have a height and a diameter greater than those of the second and third wiring vias 113b and 113c penetrating through the second and third build-up layers 111b and 111c. In addition, the first wiring via 113a may have an hourglass or cylinder shape, while the second and third wiring vias 113b and 113c may have tapered shapes of which directions are opposite to each other. A thickness of each of the wiring layers 112a, 112b, 112c, and 112d may be greater than that of the first redistribution layers 142a and 142b.

A heat dissipation layer 191 shown in FIG. 17 may be configured the same as or similar to the heat dissipation layer described in the above example and the above modified examples, and optionally, an additional heat dissipation layer (not shown) may also be included, the same as or similar to the additional heat dissipation layer described in the above modified examples. Other configurations overlap those described above, and a detailed description thereof is thus omitted.

In the present disclosure, terms "lower side", "lower portion", "lower surface", and the like, have been used to indicate a downward direction in relation to cross sections of the drawings, and terms "upper side", "upper portion", "upper surface", and the like, have been used to indicate a direction opposing the direction indicated by the terms "lower side", "lower portion", "lower surface", and the like. However, these directions are defined for convenience of explanation, and the claims are not particularly limited by the directions defined as described above, and the concept of the upper portion and the lower portion may be changed at any time.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first component may be named a second component and a second component may also be similarly named a first component, without departing from the scope of the present disclosure.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiments in the present disclosure, the semiconductor package having the heat dissipation layer, excellent in heat dissipation characteristics and does not affect the signal lines of the wiring structure may be implemented.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a connection structure comprising:
      a first insulating layer;
      a first redistribution layer disposed on the first insulating layer; and
      a first connection via penetrating through the first insulating layer and connected to the first redistribution layer;
   a semiconductor chip disposed on the connection structure;
   an encapsulant covering at least a portion of the semiconductor chip;
   a second insulating layer disposed on the encapsulant;
   a second redistribution layer comprising a signal line disposed on the encapsulant;
   a first heat dissipation layer disposed on the encapsulant and electrically insulated from the signal line; and
   a surface treatment layer disposed on an exposed region of the second redistribution layer that is exposed from the second insulating layer,
   wherein the first heat dissipation layer does not cover the surface treatment layer in a thickness direction.

2. The semiconductor package of claim 1, wherein a portion of the second redistribution layer is disposed in a region in which the first heat dissipation layer and the semiconductor chip overlap in the thickness direction.

3. The semiconductor package of claim 1, wherein the exposed region of the second redistribution layer has a plurality of patterns spaced apart from each other when viewed from above.

4. The semiconductor package of claim 1, wherein the exposed region of the second redistribution layer is surrounded by the first heat dissipation layer when viewed from above.

5. The semiconductor package of claim 1, wherein the first heat dissipation layer comprises a plurality of heat dissipation vias.

6. The semiconductor package of claim 1, wherein the first heat dissipation layer has a plate shape.

7. The semiconductor package of claim 1, wherein the second redistribution layer comprises a ground line, and
   wherein the first heat dissipation layer is electrically connected to the ground line.

8. The semiconductor package of claim 7, wherein the first heat dissipation layer and the ground line are connected to each other by a connection via penetrating through the second insulating layer.

9. The semiconductor package of claim 1, further comprising a frame disposed on the connection structure and comprising a through-hole, in which the semiconductor chip is disposed.

10. The semiconductor package of claim 9, wherein the frame comprises a wiring via connecting the first redistribution layer and second redistribution layer to each other.

11. The semiconductor package of claim 1, wherein the second redistribution layer and the first heat dissipation layer are disposed in the second insulating layer.

12. The semiconductor package of claim 11, wherein the first heat dissipation layer is embedded in the second insulating layer, and
    wherein an upper surface of the heat dissipation layer is exposed from the second insulating layer.

13. The semiconductor package of claim 11, wherein the first heat dissipation layer is disposed on the second redistribution layer.

14. The semiconductor package of claim 1, further comprising a second heat dissipation layer disposed below the connection structure.

15. The semiconductor package of claim 14, further comprising a passivation layer disposed below the connection structure and embedding the first redistribution layer,
    wherein the second heat dissipation layer is embedded in the passivation layer, and
    wherein a lower surface of the second heat dissipation layer is exposed from the passivation layer.

16. The semiconductor package of claim 15, further comprising an underbump metal bump penetrating through the passivation layer and connected to the first redistribution layer of the connection structure.

17. The semiconductor package of claim 16, wherein the underbump metal bump is surrounded by the second heat dissipation layer when viewed from below.

18. A semiconductor package comprising:
    a semiconductor chip comprising connection pads;
    a frame comprising a through-hole, in which the semiconductor chip is disposed;
    an encapsulant covering portions of the semiconductor chip and the frame, and filling into portions of the through-hole;
    a connection structure, on which the frame and the semiconductor chip are disposed, comprising first insulating layers and first redistribution layers alternately disposed, first connection vias respectively penetrating through the first insulating layers and connecting the first redistribution layers and the connection pads to each other;
    a passivation layer disposed on a lowermost one of the first insulating layers, embedding a lowermost one of the first redistribution layers, and having openings exposing portions of the lowermost one of the first redistribution layers;
    a second redistribution layer disposed on the encapsulant;
    a second insulating layer disposed on the encapsulant and embedding the second redistribution layer; and
    a heat dissipation layer embedded in at least one of the second insulating layer and the passivation layer, and having a first surface exposed from the at least one of the second insulating layer and the passivation layer, wherein the heat dissipation layer has a second surface opposite to the first surface and side surfaces connecting the first surface and the second surface, and wherein the second surface and the side surfaces are in contact with the at least one of the second insulating layer and the passivation layer.

\* \* \* \* \*